(12) United States Patent
Kudose et al.

(10) Patent No.: US 8,193,627 B2
(45) Date of Patent: Jun. 5, 2012

(54) IC CHIP MOUNTING PACKAGE PROVIDED WITH IC CHIP LOCATED IN DEVICE HOLE FORMED WITHIN A PACKAGE BASE MEMBER

(75) Inventors: Satoru Kudose, Osaka (JP); Tomokatsu Nakagawa, Osaka (JP); Tatsuya Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 441 days.

(21) Appl. No.: 12/448,106

(22) PCT Filed: Nov. 30, 2007

(86) PCT No.: PCT/JP2007/073197
§ 371 (c)(1),
(2), (4) Date: Jun. 9, 2009

(87) PCT Pub. No.: WO2008/072491
PCT Pub. Date: Jun. 19, 2008

(65) Prior Publication Data
US 2009/0273071 A1    Nov. 5, 2009

(30) Foreign Application Priority Data
Dec. 11, 2006    (JP) .................. 2006-333702

(51) Int. Cl.
*H01L 23/18* (2006.01)
*H01L 21/56* (2006.01)
*H01L 23/48* (2006.01)

(52) U.S. Cl. ........... 257/687; 257/E23.136; 257/E23.01; 257/E21.502; 257/E23.119; 257/692; 257/783; 257/784; 257/786; 257/778; 257/738

(58) Field of Classification Search ........... 257/E23.119, 257/687, 692, E21.502, E23.136, E23.01, 257/783, 784, 786, 737, 738, 778; 438/124
See application file for complete search history.

(56) References Cited

U.S. PATENT DOCUMENTS

| 2005/0263909 | A1 |   | 12/2005 | Fukuta et al. |
| 2006/0209514 | A1 | * | 9/2006  | Katoh ............................ 361/705 |
| 2007/0290302 | A1 | * | 12/2007 | Nakagawa et al. ........... 257/668 |
| 2009/0302464 | A1 | * | 12/2009 | Nakagawa et al. ........... 257/737 |
| 2010/0019394 | A1 | * | 1/2010  | Kudose et al. ................. 257/778 |

FOREIGN PATENT DOCUMENTS

| JP | 07-066326 | 3/1995 |
| JP | 2000-208536 | 7/2000 |
| JP | 2004-207566 | 7/2004 |
| WO | 2005/080502 A1 * | 9/2005 |
| WO | WO 2005/080502 | 9/2005 |

* cited by examiner

*Primary Examiner* — Alexander O Williams
(74) *Attorney, Agent, or Firm* — Harness, Dickey & Pierce, P.L.C.

(57) ABSTRACT

In one embodiment of the present invention, an IC chip mounting package is arranged such that an IC chip and a film base member are connected via an interposer, and a section in which the IC chip, the film base member, and the interposer are connected is sealed with sealing resin. The sealing resin is provided by potting sealing resin around the interposer via a potting nozzle, or is provided by potting the sealing resin around the IC chip, that is, via a device hole. Moreover, the sealing resin has a coefficient of linear expansion of not more than 80 ppm/° C., a viscosity of not less than 0.05 Pa·s but not more than 0.25 Pa·s, and also includes filler having a particle size of not more than 1 μm.

16 Claims, 8 Drawing Sheets

(a)

(b)

CROSS SECTION TAKEN ALONG LINE A-A'

(a)

(b) PUNCHING OUT DEVICE HOLE (c)

(d)

(e) FILLET / FILLET (a)

(b)

(c)

(d)

F I G. 1 2
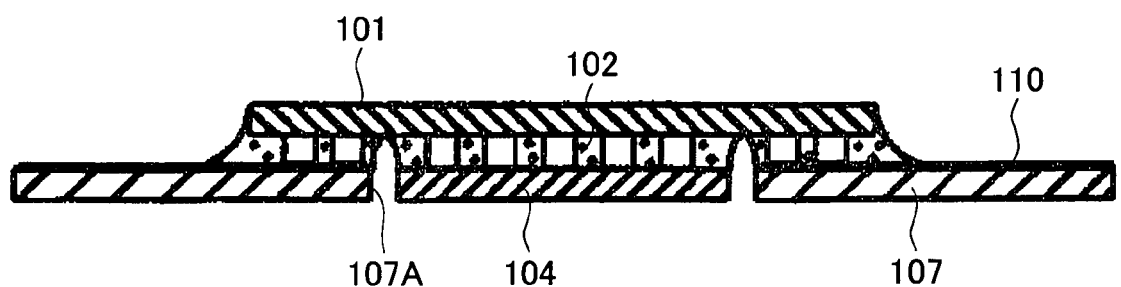

IC CHIP MOUNTING PACKAGE PROVIDED WITH IC CHIP LOCATED IN DEVICE HOLE FORMED WITHIN A PACKAGE BASE MEMBER

TECHNICAL FIELD

The present invention relates to a package for mounting an IC chip which includes, for example, finely pitched terminals.

BACKGROUND ART

With the development of a liquid crystal display apparatus with high definition and high performance, a liquid crystal, driver (IC chip) incorporated in the liquid crystal display apparatus is required to have an increased number of outputs, and also a reduced chip size.

In order to accomplish the increased number of outputs in an IC chip reduced in chip size, it is required for the chip to have bumps made in a fine pitch (smaller pitch). Recently, an SOF (System On Film), also referred to as COF (Chip On Film)) is often used. The SOF can realize the fine pitch and includes a bare chip liquid crystal driver.

In the latest SOF package, inner leads on a tape carrier are bonded to bumps on an IC chip by the application of heat and pressure so that the tape carrier is brought into conduction with the IC chip. However, such a bonding method requires a very fine tape carrier material which is less susceptible to heat deformation to prevent misalignment between bumps and inner leads. In other words, the realization of a fine pitch limits a choice of material for a tape carrier.

Moreover, the inner leads are made of copper foil; in order to carry out wire processing in fine pitch, it is required to reduce thickness of the copper foil. For example, a copper foil for a TCP having a pitch of 50 μm has a thickness of 12 μm; in order to form a pitch of 20 μm, the thickness of the copper foil requires to be around 5 μm. In order to maintain strength while providing a thin copper foil, it is required to introduce new techniques and new processing apparatuses by reviewing the currently used techniques. This causes costs required in labor work for discussing techniques and costs for introducing new equipment.

Furthermore, in a case where the wires are processed, if a processing accuracy of the processing apparatus sufficiently surpasses a wire pitch, a test that follows the processing may be carried out to just a simple degree. However, if the wires are finely pitched, and the processing accuracy is closer to the wire pitch, a thorough test is necessarily carried out after the processing, of whether or not there is a part left that is insufficiently processed, or the like. This causes an increase in testing costs.

As a method of solving such a problem, Patent Literature 1 (Japanese Patent Application Publication, Tokukai, No. 2004-207566 A (published on Jul. 22, 2004) discloses a method in which an IC chip is connected to a circuit board (tape carrier) via an interposer substrate. FIG. 12 illustrates a cross sectional view of a package structure described in Patent Literature 1.

As illustrated in FIG. 12, an IC chip 104 is connected to an interposer 101 by flip chip bonding. The interposer 101 is further connected to a terminal pattern 110 of a circuit board 107 by bump bonding. The circuit board 107 has a device hole 107A which corresponds to a region in which the IC chip 104 is provided.

The interposer 101 is a silicon (Si) substrate and is formed in a Si wafer process. This makes it possible to form electrodes of the interposer 101 which electrodes are connected to the electrodes of the IC chip 104, at a pitch as fine as that of the electrodes of the IC chip 104. On the other hand, electrodes of the interposer 101 which electrodes are connected to the circuit board 107 are formed at a pitch that agrees with a pitch of the electrodes of the circuit board 107, which pitch is relatively large. The electrodes connected to the IC chip 104 are connected to the corresponding electrodes connected to the circuit board 107, on the interposer 101. As the circuit board 107, a tape carrier can be used.

A part where the circuit board 107, the IC chip 104, and the interposer 101 are connected are sealed with sealing resin, so as to be protected from external environment.

In other words, the interposition of the interposer 101 as illustrated in FIG. 12 allows a fine pitch of the IC process to be changed to an electrode pitch of the tape carrier. Hence, it is possible to avoid increase in manufacturing cost and testing costs even with the use of an SOF package in which an IC chip whose connecting terminals are provided at a very fine pitch is included for reduced size or increased outputs of the IC chip.

CITATION LIST

Patent Literature 1
Japanese Patent Application Publication, Tokukai, No. 2004-207566 A (Publication Date: Jul. 22, 2004)

SUMMARY OF INVENTION

However, in the structure in which the IC chip 104 and the circuit board 107 are connected via the interposer 101 as disclosed in Patent Literature 1, problems occur such as a decrease in sealing reliability at a connected section using sealing resin, which decrease is caused by opening the device hole 107A in the circuit board 107.

Namely, in a conventional SOF structure which directly connects the IC chip to the circuit board, the IC chip and the circuit board can be sealed without any air bubbles or the like generating, by potting the sealing resin so as to draw around the IC chip, which causes the sealing resin to permeate between the IC chip and the circuit board by capillary action.

On the other hand, in the structure in which the IC chip 104 and the circuit board 107 are connected via the interposer 101, in a case where the sealing resin is provided so as to draw around the IC chip, a space between a periphery of the IC chip 104 and a periphery of the device hole 107A serves as a dam, thereby causing a decrease in performance of the resin filling by capillary action. As a result, the sealing resin may not be sufficiently permeated between the IC chip and the circuit board.

Moreover, in the conventional SOF structure, resin for sealing a surrounding of the IC chip is provided on the tape base member. Consequently, when the sealing resin thermally expands or contracts, the tape base member deforms so as to absorb any effects caused by the thermal expansion or contraction of the sealing resin. Therefore, it is difficult for the sealing resin to crack due to the thermal expansion or contraction of the sealing resin.

However, in the structure in which the IC chip 104 and the circuit board 107 are connected via the interposer 101, the resin for sealing the IC chip 104 is provided on the interposer 101, which interposer 101 has high rigidity. Therefore, there is also a problem that a crack may easily generate around the IC chip 104 or in the space between the IC chip 104 and the interposer 101, in the case where the sealing resin thermally expands or contracts.

The present invention is accomplished in view of the problems, and its object is to realize an IC chip mounting package which is capable of carrying out a highly reliable resin sealing.

An IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin having a coefficient of linear expansion of not more than 80 ppm/° C.

In a conventional SOF structure in which an IC chip is mounted on a package base member made of a tape carrier, in a case where sealing resin thermally expands or contracts, which sealing resin seals a section where the IC chip and the package base member are bonded, any effects caused by the expansion or contraction is absorbed by deformation of tape. However, in the present structure in which the IC chip and the package base member are connected via an interposer, the sealing resin is provided on an interposer, which interposer has high rigidity. Therefore, if the sealing resin thermally expands or contracts, the effect caused by the expansion or contraction cannot be absorbed by the deformation of the package base member. Hence, the sealing resin may easily crack.

According to the structure, by having the sealing resin have a coefficient of linear expansion of not more than 80 ppm/° C., the thermal expansion or contraction of the sealing resin is suppressed, thereby preventing cracking of the sealing resin.

Moreover, another IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin having a viscosity of not less than 0.05 Pa·s but not more than 0.25 Pa·s.

In the present structure in which a device hole is present in the package base member, if the sealing resin has a viscosity around the same viscosity as a sealing resin used in a conventional SOF structure, the sealing resin permeates too fast along the base member and through the device hole since the viscosity of the sealing resin is too low. As a result, air bubbles remain between the IC chip and the interposer. Hence, insufficient filling easily occurs.

According to the structure, by having the sealing resin have a viscosity of not less than 0.05 Pa·s but not more than 0.25 Pa·s, deficiency caused by the insufficient filling is prevented. The sealing resin does not need to demonstrate the viscosity in the above range at room temperature; for example, the sealing resin may be one which is made to have the viscosity in the above range at a time of filling due to application of heat.

Moreover, in order to attain the object, another IC chip mounting package in accordance with the present invention includes: an IC chip having input/output terminals; and a package member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin including filler which has a particle size of not more than 1 µm.

According to the structure, by having a filler size contained in the sealing resin be not more than 1 µm, the space between the IC chip and the interposer is sufficiently filled, even when a smallest value of the bump intervals is around 1 µm.

Moreover, a method in accordance with the present invention for manufacturing an IC chip mounting package, which IC chip mounting package includes an IC chip having input/output terminals and a package base member for mounting the IC chip, and which package base member has first connection terminals, is a method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the method further including the step of: sealing the package base member, the IC chip, and the interposer with sealing resin at their respective connecting sections, the sealing resin being provided by applying the sealing resin around the interposer.

According to the structure, a fillet is securely formed around the interposer. Therefore, stability of area, particularly on a package base member side which is unstable, is enhanced. Furthermore, the device hole may be set as having a size with respect to the IC chip smaller than a size of the device hole in a conventional structure. As a result, size reduction is possible for the IC chip mounting package itself, thereby being advantageous in costs.

Moreover, another method in accordance with the present invention for manufacturing the IC chip mounting package, which IC chip mounting package includes an IC chip having input/output terminals and a package base member for mounting the IC chip, and which package base member has first connection terminals, is a method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the method further including the step of: sealing the package base member, the IC chip, and the interposer with sealing resin at their respective connecting sections, the sealing resin being provided by applying the sealing resin around the IC chip.

According to the structure, resin filling performance is improved, particularly in a space between the IC chip and the interposer. This makes it possible to avoid insufficient resin filling.

BRIEF DESCRIPTION OF DRAWINGS

FIG. 12 is a cross sectional view illustrating a structure of a conventional technique.

DESCRIPTION OF EMBODIMENTS

One embodiment of the present invention is described below with reference to FIGS. 1 through 11. The following description includes various limitations. These are technically preferred in the implementation of the present invention, but by no means limiting the scope of the present invention.

Figure 2:
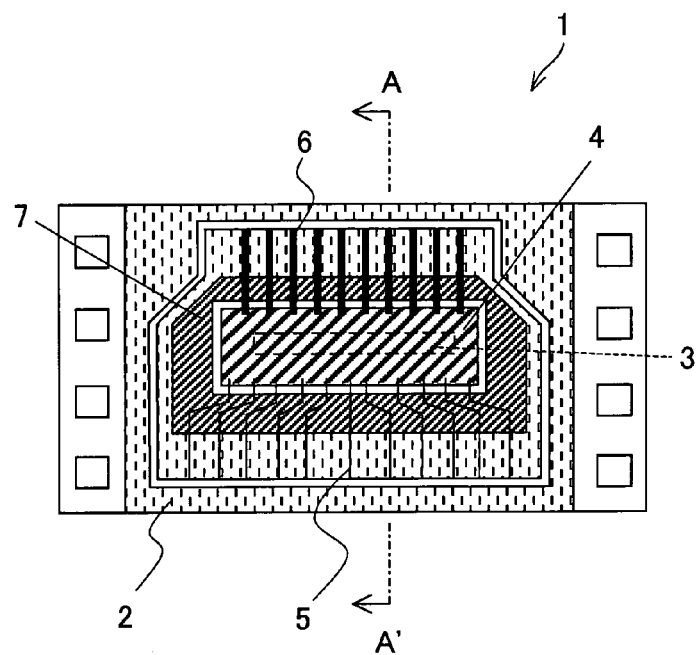
FIG. 2 is a plan view illustrating a structure of an IC chip mounting package in accordance with the present embodiment.
Figure 3:
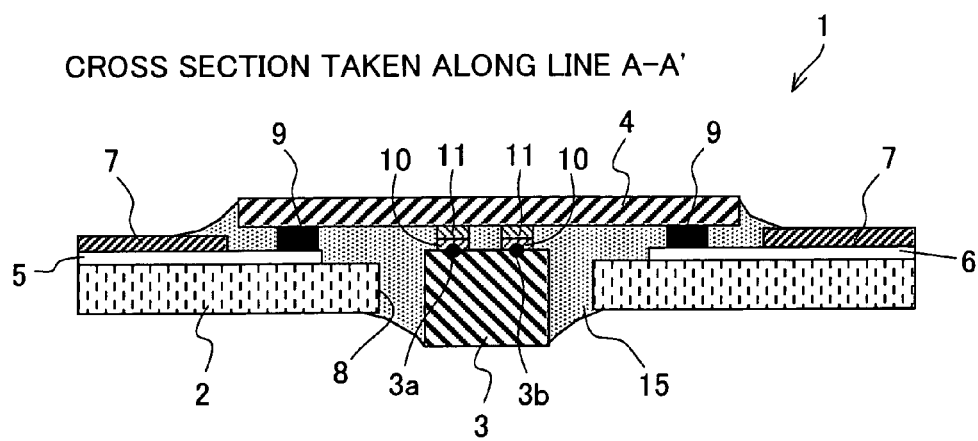
FIG. 3 is a cross sectional view illustrating a cross section of the IC chip mounting package taken on line A-A' illustrated in FIG. 2.

FIG. 2 is a plan view illustrating a structure of an IC chip mounting package 1 in accordance with the present embodiment. FIG. 3 is a cross sectional view of the IC chip mounting package 1 taken along line A-A of FIG. 2.

The mounting package 1 briefly is arranged including a film base member (tape carrier) 2, which is a package base member, an IC chip 3, and an interposer 4. FIG. 2 illustrates the mounting package 1 from a side on which the interposer 4 is provided. For convenience in explanation, FIG. 3 is illustrated so as to have the IC chip 3 face downwards in the figure. FIG. 3 illustrates one part of a cross section taken along line A-A'.

In the mounting package 1, the film base member 2 has a hole section called a device hole 8, and the IC chip 3 is provided inside the device hole 8.

The film base member 2 has on-film wires 5 and 6 provided around the device hole 8. The on-film wires 5 and 6 are electrically connected to the interposer 4 at ends on the device hole 8 side, via first bumps 9. Since the interposer 4 is electrically connected to the IC chip 3, the on-film wires 5 and 6 become electrically connected to the IC chip 3 via the interposer 4. That is to say, the on-film wires 5 are output wires for sending signals (for example drive signals) outputted from the IC chip 3 to a liquid crystal display (not illustrated), and the on-film wires 6 are input wires for inputting control signals (for example image data signals) to the IC chip 3. Details of this arrangement are described later.

The on-film wires 5 and 6 have solder resists 7 provided thereon. The solder resist 7 insulates and protects the wires.

In the present liquid crystal driver mounting package, the IC chip 3 is provided as a liquid crystal driver for driving a liquid crystal display. For this reason, the IC chip 3 has a plurality of liquid crystal drive circuits (not illustrated). The liquid crystal drive circuits include, as illustrated in FIG. 3, drive signal output terminals 3a via which respective drive signals are outputted, and signal input terminals 3b (input/output terminals) via which image data signals and other signals are respectively inputted. Moreover, the IC chip 3 has third bumps 10 for each of the drive signal output terminals 3a and the signal input terminals 3b.

The interposer 4 has one of its sides electrically connected to the IC chip 3 and the film base member 2. More specifically, the interposer 4 has the first bumps 9 and second bumps 11 provided on one of its sides, and as illustrated in FIG. 3, the film base member 2 and the interposer 4 are electrically connected via the first bumps 9, and the IC chip 3 and the interposer 4 are electrically connected by connecting respective second bumps 11 and third bumps 10. Semiconductor material may be used as material for the interposer 4; preferably, silicon is used. The interposer 4 is not particularly limited in its size, however may be of a size of 2 mm×20 mm with a thickness of 400 μm, for example.

Sealing resin 15 illustrated in FIG. 3 is provided so as to cover the device hole 8 of the film base member 2, the on-film wires 5 and 6, and a side of the interposer 4 on which the first and second bumps are provided. The sealing resin 15 is provided for protecting this connecting section from external environment.

Figure 4:
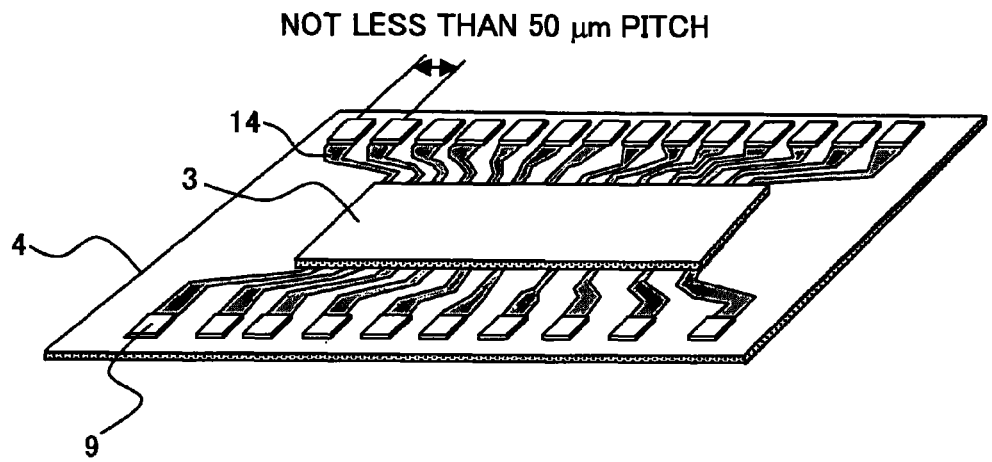
FIG. 4 is a perspective view illustrating a structure of an IC chip and an interposer provided in the IC chip mounting package illustrated in FIG. 2.
Figure 5:
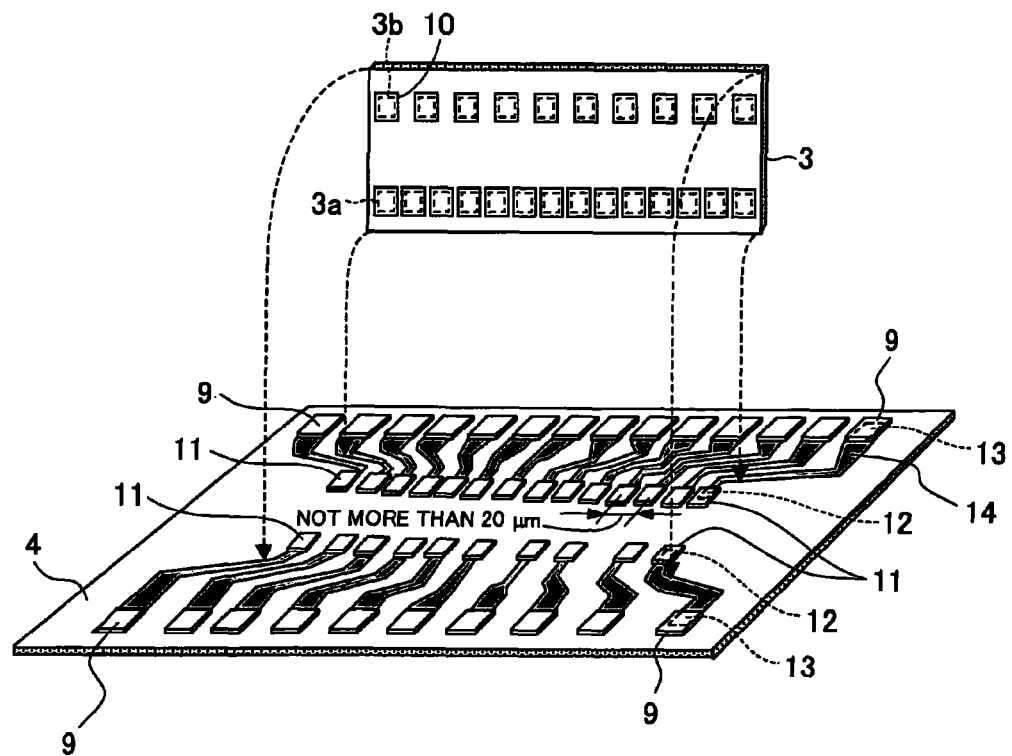
FIG. 5 is a perspective view illustrating structures of an IC chip and an interposer provided in the IC chip mounting package illustrated in FIG. 2, at a stage prior to mounting the IC chip to the interposer.

The following description specifically explains a structure of the interposer 4, with reference to FIGS. 4 and 5.

FIG. 4 is a perspective view illustrating the structure of the interposer 4 to which the IC chip 3 is mounted. FIG. 5 is a perspective view illustrating structures of the IC chip 3 and the interposer 4 at a stage prior to the mounting of the IC chip 3. Note that a part of FIG. 5 is an opened-up view.

The interposer 4 includes, as illustrated in FIG. 5, IC chip connecting terminals 12, film base member connecting terminals 13, and on-interposer wires 14. The IC chip connecting terminals 12 are terminals to be connected to respective drive signal output terminals 3a and signal input terminals 3b. The film base member connecting terminals 13 are terminals to be connected to respective terminals of the on-film wires 5 and 6 of the film base member 2. The on-interposer wires 14 are wires which connect respective IC chip connecting terminals 12 and respective film base member connecting terminals 13 on the interposer 4.

More specifically, the interposer 4 has the IC chip connecting terminals 12 provided near a center of the interposer 4, and the film base member connecting terminals 13 provided near a periphery of the interposer 4. Second bumps 11 are provided on the IC chip connecting terminals 12, and first bumps 9 are provided on the film base member connecting terminals 13. The second bumps 11 are provided so as to respectively match with third bumps 10 provided on the drive signal output terminals 3*a* and signal input terminals 3*b*. The structure illustrated in FIG. 4 is accomplished by having the second bumps 11 match with the third bumps 10, respectively.

The second bumps 2 provided on the interposer 4 have a same pitch as that of the third bumps 10 provided on the IC chip 3. Namely, since the IC chip 3 is a multi-output liquid crystal driver, the third bumps 10 are finely pitched. More specifically, the third bumps 10 are provided so as to have a pitch which exceeds 0 μm but not more than 20 μm. Consequently, the second bumps 11 are also provided so as to have a fine pitch of not more than 20 μm, as illustrated in FIG. 5.

On the other hand, the first bumps 9 of the interposer 4 have a pitch larger than the pitch of the second bumps 11. More specifically, the first bumps 9 have a pitch of not less than 50 μm, as illustrated in FIG. 4. That is to say, the film base member connecting terminals 13 on the interposer 4 have a larger pitch than that of the IC chip connecting terminals 12. Hence, the terminals of the on-film wires 5 and 6 of the film base member 2 connected via the first bumps 9 of the interposer 4 are provided so as to have a pitch of not less than 50 μm, so that the pitch of the terminals of the on-film wires 5 and 6 match with the pitch of the first bumps 9.

As such, according to the structure of the mounting package 1 of the present embodiment, the interposer 4 has the IC chip connecting terminals 12 provided so as to agree with the pitch of the terminals of the IC chip 3, and the film base member connecting terminals 13 provided in a larger pitch than that of the IC chip connecting terminals 12. Therefore, even if the terminals of the IC chip 3 are finely pitched, the pitch of the on-film wires 5 and 6 of the film base member 2 do not need to be finely pitched so as to agree with the IC chip 3. Namely, the on-film wires 5 and 6 (inner leads) of the film base member 2 do not need to be finely pitched; the on-film wires 5 and 6 may be provided with an existing technique so as to have a pitch of not less than 50 μm. Hence, no technical innovation such as reduction in a thickness of a copper foil or any equipment such as a new processing machine for accommodating the technical innovation is necessary, and therefore an IC chip mounting package is provided which allows remarkable suppression of increase in required cost and technique.

As such, in the mounting package 1, providing the interposer 4 allows the terminals of the IC chip to be finely pitched as much as possible, without the need to consider the terminal pitch of the film base member 2. This allows reduction in chip size of the IC chip 3, thereby reducing costs. As from the above, the structure of the present invention provides, by use of an existing technique and not requiring any technical innovations, an IC chip mounting package in which a finely pitched IC chip is mounted.

The present embodiment has been explained as a liquid crystal driver mounting package structured for driving a liquid crystal display. However, an IC chip mounting package of the present invention is not limited to this package. Namely, the IC chip mounting package of the present invention may be applied as a package for mounting driving elements of an EL (electroluminescence) display, or mounting elements to be mounted inside an apparatus such as various portable electronic apparatuses.

Figure 6:
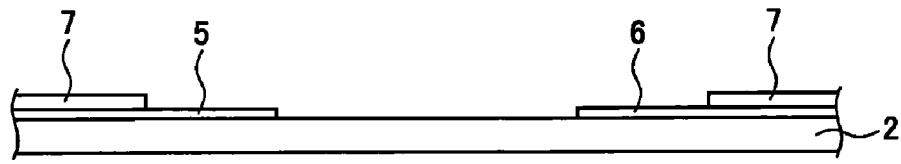
FIGS. 6(a) through (e) of FIG. 6 are cross sectional views illustrating a manufacturing procedure of the IC chip mounting package illustrated in FIG. 2.
Figure 6:
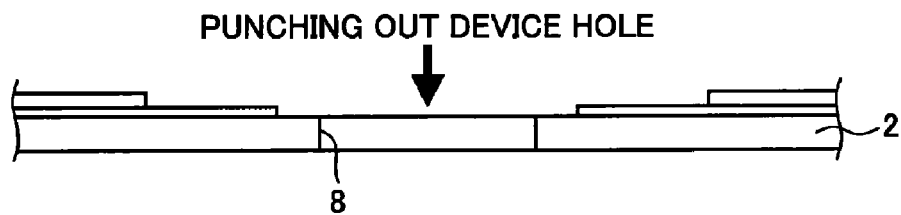
Figure 6:
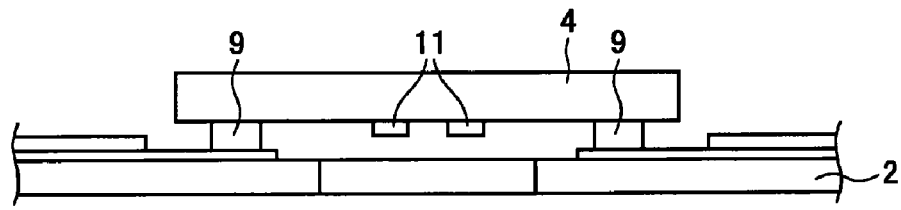
Figure 6:
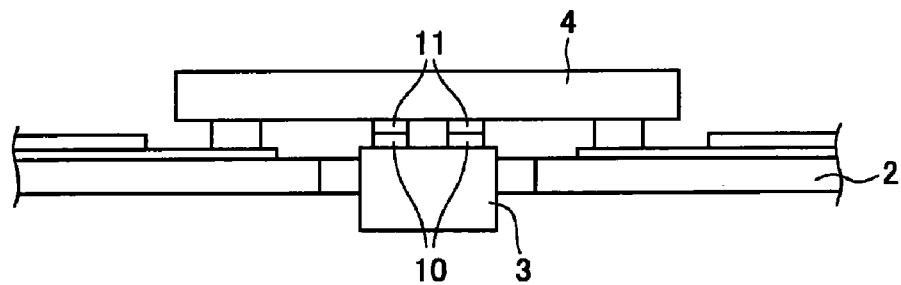
Figure 6:
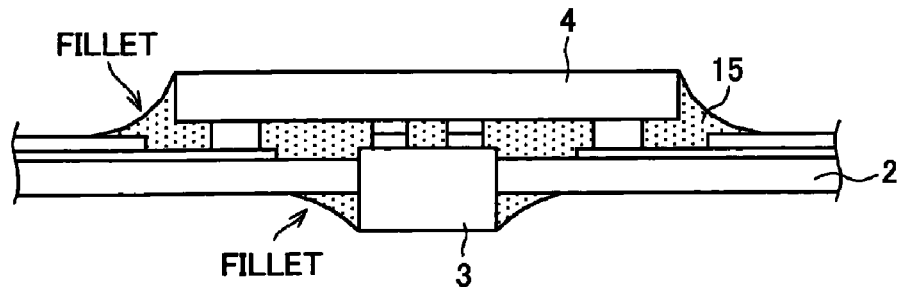

The following description explains briefly of a procedure for manufacturing the mounting package 1 of the above structure, with reference to FIGS. 6(*a*) through 6(*e*). Wires, bumps, and other members required for the film base member 2, the IC chip 3, and the interposer 4 immediately before mounting have all been provided beforehand. Manufacturing steps as similar to manufacturing steps of a conventional IC mounting package may be carried out to provide these members; hence, detailed explanations thereof are omitted here.

FIG. 6(*a*) is an explanatory view illustrating the film base member 2 on which the IC chip 3 and the interposer 4 have not yet been mounted. The on-film wires 5 and 6 and the solder resist 7 are already provided on the film base member 2. First, as illustrated in FIG. 6(*b*), the film base member 2 is punched so as to open the device hole 8.

Next, as illustrated in FIG. 6(*c*), the interposer 4 is bonded to the film base member 2. At this point, the first bumps 9, the second bumps 11, and the on-interposer wires for connecting these bumps have already been formed on the interposer 4. The bonding of the interposer 4 is carried out by aligning respective first bumps 9 on the interposer 4 to respective connecting terminals on the film base member 2, and then heating and applying pressure thereto by use of a bonding tool.

Subsequently, as illustrated in FIG. 6(*d*), the IC chip 3 is bonded to the interposer 4. At this point, the third bumps 10 have already been provided on the IC chips 3. The bonding of the IC chip 3 is carried out by aligning respective third bumps 10 on the IC chip 3 to respective second bumps 11 on the interposer 4, and then heating and applying pressure thereto by use of the bonding tool.

Finally, as illustrated in FIG. 6(*e*), the connected section is sealed by the sealing resin 15 to protect the connected section from the external environment. This completes the construction of the mounting package 1. Sealing resin 15 completely fills (i) a space between the IC chip 3 and the interposer 4, (ii) a space between the film base member 2 and the interposer 4, and (iii) inside the device hole 8. Further, fillets are formed around the IC chip 3 and around the interposer 4 with the sealing resin 15.

Steps in FIGS. 6(*a*) through 6(*e*) are carried out in a state in which the film base member 2 is of a long tape carrier material. The mounting package 1 as a final product is obtained by individually punching out mounting packages 1 from this tape carrier material.

A mounting package 1 in accordance with the present embodiment is characterized by, particularly a point in which a highly reliable resin sealing is possible at the sealing step illustrated in FIG. 6(*e*). The following description explains this characteristic feature in detail.

Figure 1:
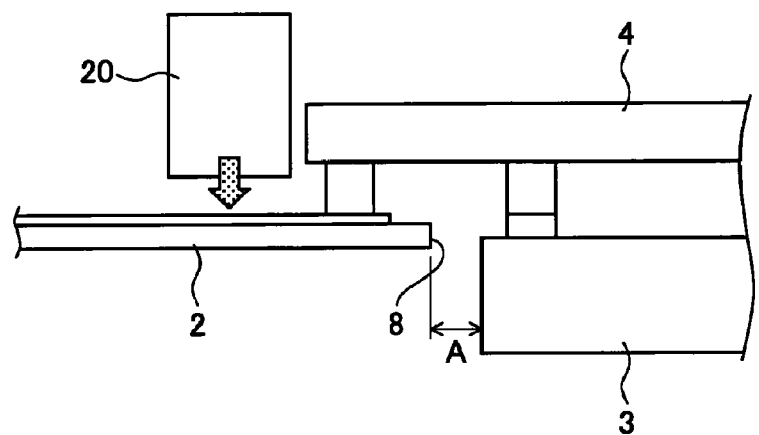
FIG. 1 is a cross sectional view illustrating a part in which a film base member, an IC chip, and an interposer are bonded in an IC chip mounting device of an embodiment of the present invention, and (a) illustrates a method for applying sealing resin around the interposer, and (b) illustrates a method for applying the sealing resin around the IC chip.
Figure 1:
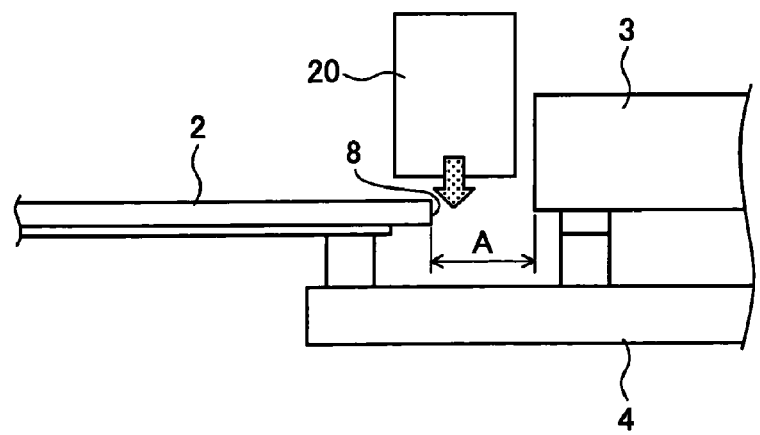

(a) and (b) of FIG. 1 are explanatory views illustrating a method for potting the sealing resin 15 to the mounting package 1. FIG. 1(*a*) illustrates, as a first method, a method for potting sealing resin in such a manner that the sealing resin is drawn around the interposer 4.

The first method pots the sealing resin 15 around the interposer 4 from a potting nozzle 20. The sealing resin thus potted permeates through spaces between the film base member 2 and the interposer 4 by capillary action, thereby filling the spaces. Furthermore, the sealing resin 15 permeates through to the IC chip 3 side via the device hole 8, and forms a fillet around the IC chip 3. Further, the sealing resin 15 also permeates through spaces between the IC chip 3 and the interposer 4 by capillary action, and fills the spaces with the resin.

Figure 7:
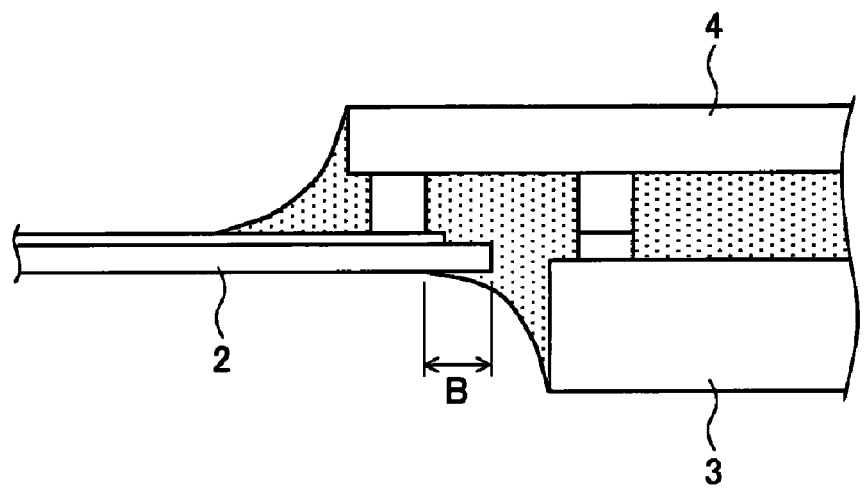
FIG. 7 is an explanatory view illustrating a sealing resin fillet formed around an IC chip.

It is preferable for the fillet formed around the IC chip 3 to partially cover a reverse side (reverse side to the potted side, side on which the IC chip is provided) of the film base member 2, as illustrated in FIG. 7. Moreover, it is preferable for the fillet to have a width B illustrated in FIG. 7 of not less than 5 µm. Covering the reverse side of the film base member 2 by the fillet suppresses generation of resin crack from a periphery of the device hole 8. This improves reliability of resin sealing.

According to the first method, a fillet is securely formed around the interposer 4. Hence, stability of area, particularly on a package base member side which is unstable, is enhanced.

Moreover, in the first method, it is preferable for a distance A between a periphery of the IC chip 3 and a periphery of the device hole 8 to be relatively short, in order to have the sealing resin 15 thus potted from around the interposer 4 fill the spaces between the film base member 2 and the interposer 4, and further fill the spaces between the IC chip 3 and the interposer 4.

More specifically, it is preferable for the distance A to be not more than 150 µm. Namely, with the mounting package 1 in which the sealing resin 15 is filled by the first method, the device hole 8 may be set as having a size with respect to the IC chip 3 smaller than a size of the device hole in a conventional structure. As a result, size reduction is possible for the IC chip mounting package 1, thereby being advantageous in costs. If the distance A is not less than 150 µm, a space between the periphery of the IC chip 3 and the periphery of the device hole 8, i.e. a space inside the device hole 8 serves as a dam, thereby causing a decrease in performance of the resin filling by capillary action. This causes adverse effects to the resin filling property between the IC chip 3 and the interposer 4. In other words, insufficient filling of resin occurs between the IC chip 3 and the interposer 4, which causes easy generation of air bubbles. If the distance A is too long, it also becomes difficult for the fillet to form around the IC chip 3. For example, the distance A as 400 µm generated a nonconforming item at a high rate of approximately 60%.

Note that the following problem occurs when the distance A is too short. If the distance A is shorter than 30 µm, the resin which flows inside the device hole 8 decreases in amount. This makes it difficult for the resin fillet to form at cut edges of the IC chip 3. As a result, sealing strength of the IC chip 3 decreases. For example, a nonconforming item generates at a high rate of approximately 95%, when the distance A is 20 µm. Therefore, it is preferable for the distance A to be at least 30 µm.

FIG. 1(b) illustrates a method, as a second method, for potting sealing resin in such a manner that the sealing resin is drawn around the IC chip 3.

In the second method, the sealing resin 15 is potted around the IC chip 3, i.e. via the device hole 8, from the potting nozzle 20. The sealing resin thus potted permeates through the spaces between the film base member 2 and the interposer 4 and through the spaces between the IC chip 3 and the interposer 4 by capillary action, thereby filling these spaces.

With the second method, resin filling performance is improved, particularly in the spaces between the IC chip 3 and the interposer 4. This makes it possible to avoid insufficient resin filling. Namely, in the first method, the space between the periphery of the IC chip 3 and the periphery of the device hole 8 serves as a dam, and causes the sealing resin 15 thus potted around the interposer 4 to decrease in resin filling performance by capillary action. This may cause insufficient filling of the spaces between the IC chip 3 and the interposer 4. In comparison, the second method has no such possibility.

Furthermore, in the first method in which the sealing resin 15 is potted around the interposer 4, a resin region around the interposer 4 easily becomes large in area. This causes an increase in area of a region in which the mounting package cannot be bent. In the second method, on the other hand, the resin region around the interposer 4 can be reduced in area. Thus, it is possible to reduce the area of the region that cannot be bent in the mounting package.

In the second method, in order to sufficiently carry out filling of the sealing resin 15 via the device hole 8, it is preferable for the distance A between the periphery of the IC chip 3 and the periphery of the device hole 8 to be longer than that in the mounting package 1 in which the sealing resin 15 is filled by the first method. More specifically, it is preferable for the distance A to be at least 100 µm.

Furthermore, it is preferable for the distance A to be not more than 700 µm (around ¾ of a dimension of the potting nozzle), so that the distance A is shorter than the dimension of the potting nozzle 20. This is because if the distance A is longer than the dimension of the potting nozzle, a tip of the potting nozzle 20 protrudes into a space between the periphery of the IC chip 3 and the periphery of the device hole 8. This may cause the tip of the nozzle to have impact with the periphery of the device hole 8 due to displacement of the tip of the nozzle at the time of setting up the nozzle. Furthermore, the dimension of the potting nozzle set smaller than the distance A allows applying a part of resin from the potting nozzle 20 directly to the film base member 2. Thus, it is advantageous that the fillet around the IC chip 3 is easily formed.

Figure 8:
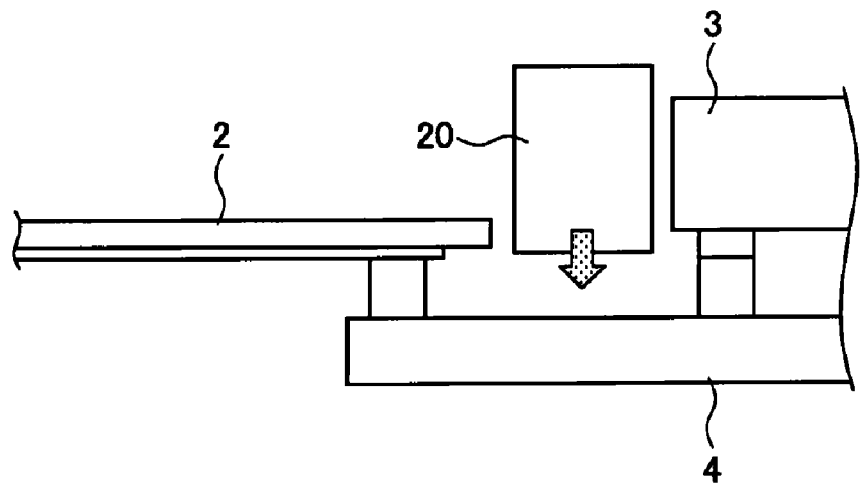
FIG. 8 illustrates a method for applying sealing resin around an IC chip.

However, if the filling performance of the resin in the space between the IC chip 3 and the interposer 4 is to be emphasized, the distance A may be longer than the dimension of the potting nozzle 20, as illustrated in FIG. 8. In this case, so as to avoid deficiency at the tip of the nozzle coming into impact with the periphery of the device hole 8, the distance A is preferably longer than the dimension of the potting nozzle by at least 80 µm. The length of at least 80 µm is calculated in view of dimensional accuracy of the device hole 8 of ±30 µm and a variation of nozzle set up of 50 µm.

Moreover, the distance A between the periphery of the IC chip 3 and the periphery of the device hole 8 may be the same length for all four respective sides of the peripheries as illustrated in FIG. 9(a) (i.e., a=b=c=d). However, the lengths between respective sides may be made different from each other. For example, as illustrated in FIG. 9(b), distances between respective short sides may be made longer than distances between respective long sides (i.e., a=b<c=d), so as to reinforce the resin provided near the short sides at which resin peeling easily occurs.

Figure 9:
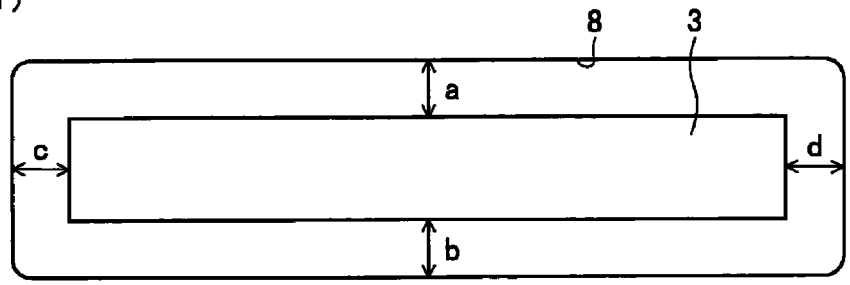
FIG. 9 is a plan view illustrating a size relationship between an IC chip and a device hole.
Figure 9:
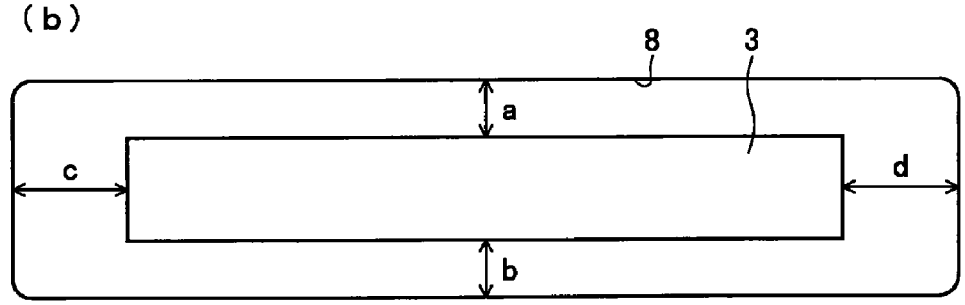
Figure 9:
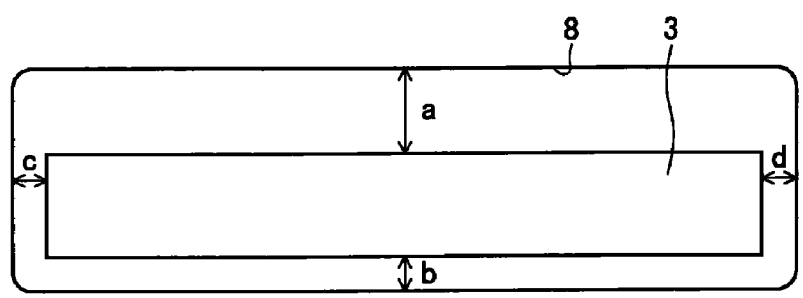
Figure 9:
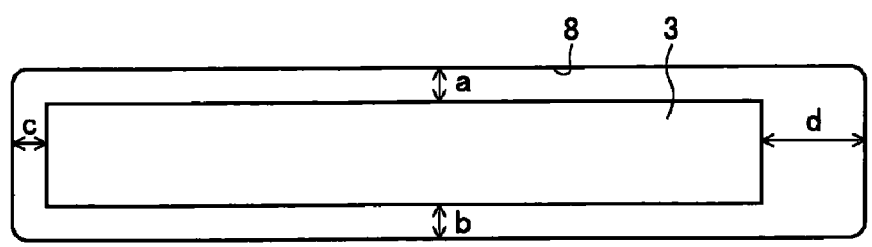

Alternatively, as illustrated in (c) and (d) of FIG. 9, the IC chip 3 and the device hole 8 may have their centers not in line with each other. This allows application of the sealing resin 15 on just one side or one point, thereby improving productivity at a time of resin sealing. That is to say, FIG. 9(c) is an example where a relationship of the lengths between respective sides satisfy a>b=c=d, which allows application of resin between just one side of the peripheries which correspond to the distance a, and FIG. 9(d) is an example where the relationship of the lengths between respective sides satisfy a=b=c<d, which allows application of resin to just one point of short sides corresponding to the distance d. Needless to say, the relationship of the distance between the periphery of the IC chip 3 and the periphery of the device hole 8 is not limited to the above examples.

The following description explains a suitable property of the sealing resin 15, in the mounting package 1 in accordance with the present embodiment.

The first explanation is about a coefficient of linear expansion of the sealing resin 15. With the structure of the mounting package 1 in which the IC chip 3 and the film base member 2 are connected via an interposer 4, the sealing resin 15 which seals the IC chip 3 is provided on the interposer 4 which has high rigidity. Therefore, in a case where thermal expansion or contraction occurs to the sealing resin, any effects caused by this expansion or contraction cannot be absorbed by deformation of the film base member 2. As a result, the sealing resin 15 easily cracks around the IC chip 3 and in the space between the IC chip 3 and the interposer 4. In order to prevent such crack, it is preferable for the sealing resin 15 to have a lower coefficient of expansion than that of sealing resin used in a conventional SOF structure.

Figure 10:
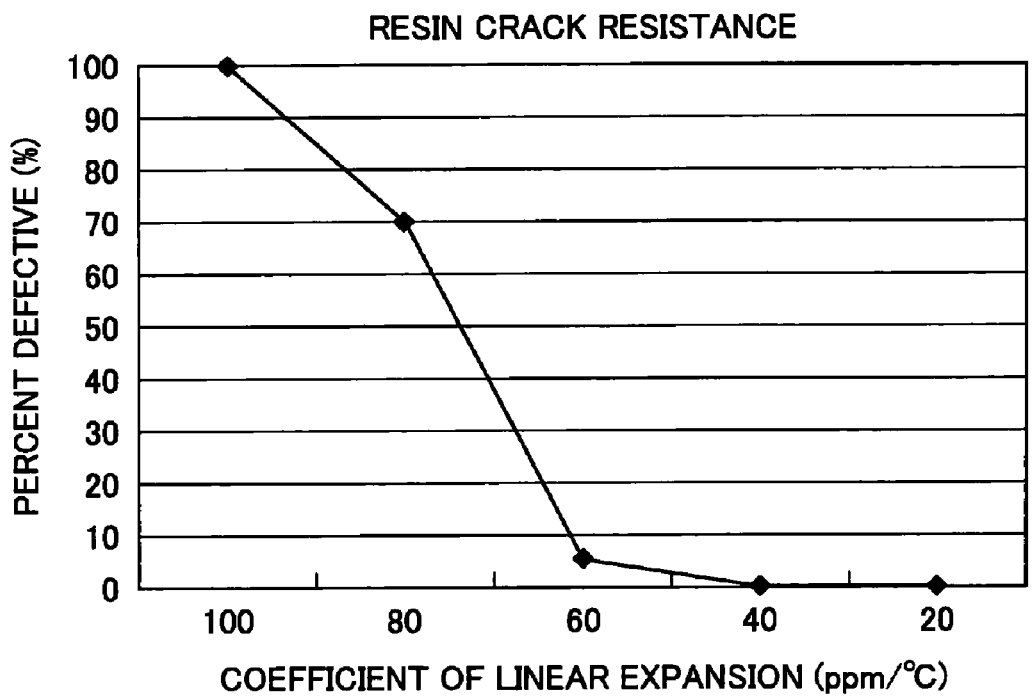
FIG. 10 is a graph illustrating a relation between a coefficient of linear expansion of sealing resin and a rate of occurrence of a resin crack defect.

FIG. 10 is a graph illustrating a coefficient of linear expansion and a rate of occurrence of defect caused by resin crack, of the sealing resin 15. Moreover, FIG. 11 is a graph illustrating a relation between a coefficient of linear expansion and a rate of occurrence of insufficient bonding (i.e., peeling of resin bonding section) when a temperature cycle is applied.

In FIG. 10, the coefficient of linear expansion and a percent defective (resin crack) are measured followed by carrying out a temperature cycle (at −40° C. for 30 minutes, at 125° C. for 30 minutes) 300 times. Good or poor of the coefficient of linear expansion and percent defective are determined by examining a fillet section of both chips by use of a stereoscopic microscope/metallurgical microscope, and by examining a section between chips by use of an infrared microscope. Moreover, FIG. 11 shows a result of the coefficient of linear expansion and percent defective (peeling of resin bonding section) that are evaluated by electrical inspection followed by carrying out the temperature cycle (at −40° C. for 30 minutes, at 125° C. for 30 minutes) 300 times. Observation of a cross section of the deficient terminal section and a check of an interface state of the bonding section are also carried out so as to confirm the inspection.

Figure 11:
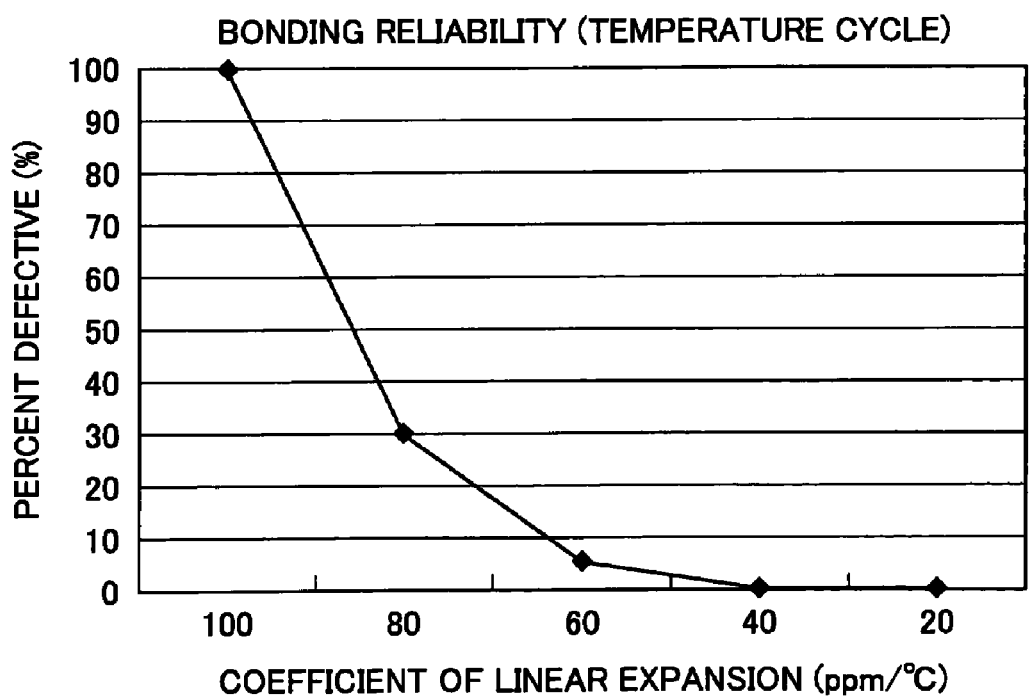
FIG. 11 is a graph illustrating a relation between a coefficient of linear expansion of sealing resin and a rate of occurrence of insufficient bonding when a temperature cycle is applied to the sealing resin.

As in FIGS. 10 and 11, when the coefficient of linear expansion is 100 ppm/° C., the percent defective is 100% for both the resin crack and the insufficient bonding, however when the coefficient of linear expansion is 80 ppm/° C., the percent defective of the resin crack is reduced to approximately 70% and the percent defective of the insufficient bonding is reduced to approximately 30%. As such, it is preferable for the coefficient of linear expansion of the sealing resin 15 to be not more than 80 ppm/° C. Moreover, when the coefficient of linear expansion is 60 ppm/° C., the percent defective of both the resin crack and the insufficient bonding remarkably decreases, to approximately 5%. Hence, it is further preferable for the sealing resin 15 to have the coefficient of linear expansion of not more than 60 ppm/° C. Furthermore, when the coefficient of linear expansion is 40 ppm/° C., the percent defective of both the resin crack and the insufficient bonding becomes approximately 0%, and the deficiency is substantially completely solved. Hence, it is most preferable for the sealing resin 15 to have the coefficient of linear expansion of not more than 40 ppm/° C. Moreover, it is preferable for the sealing resin 15 to have a lower limit of the coefficient of linear expansion as not less than 30 ppm/° C., mainly in view of material costs of the sealing resin 15.

The following second description explains a viscosity of the sealing resin 15. In a structure of the mounting package 1 in which the IC chip 3 and the film base member 2 are connected via the interposer 4, the film base member 2 has a device hole 8. If potting is carried out with sealing resin 15 having a viscosity of around 0.015 to 0.045 Pa·s in the present structure, which viscosity is similar to that of sealing resin used in a conventional SOF structure, insufficient filling easily occurs between the IC chip 3 and the interposer 4 (particularly, in the first method), since the viscosity of the sealing resin 15 is too low. A cause for this is assumed to be for the following reason. That is to say, if the viscosity of the sealing resin 15 is too low, the resin that is potted around the interposer 4 rapidly permeates between the interposer 4 and the film base member 2 by capillary action, so as to surround the periphery of the IC chip 3. As a result, air bubbles remain between the IC chip 3 and the interposer 4, thereby easily causing insufficient filling. In order to prevent the insufficient filling due to this effect, it is preferable for the sealing resin 15 to have a viscosity of at least 0.05 Pa·s.

On the other hand, if the viscosity of the sealing resin 15 is too high, it becomes difficult for the sealing resin 15 to permeate between the IC chip 3 and the interposer 4 via the device hole 8. Hence, the insufficient filling easily occurs between the IC chip 3 and the interposer 4. In order to prevent such deficiency, it is preferable for the sealing resin to have a viscosity of not more than 0.25 Pa·s.

As described above, it is preferable for the sealing resin to have a viscosity of not less than 0.05 Pa·s but not more than 0.25 Pa·s. The sealing resin 15 does not need to demonstrate the viscosity of the foregoing range at room temperature; the sealing resin 15 may be sealing resin which demonstrates the viscosity of the foregoing range at the time of filling, which range is attained by preheating the sealing resin 15, for example (in actual use, resin having a viscosity in a range of 3 Pa·s to 15 Pa·s at room temperature is preheated, so as to be used at a state having a viscosity in a range of 0.05 Pa·s to 0.25 Pa·s).

The following third description explains a filler size contained in the sealing resin 15. Normally, filler is contained in sealing resin that is used in SOF, so that strength of the sealing resin is improved. In the mounting package 1, it is preferable for the filler size contained in the sealing resin 15 to be not more than 1 μm.

That is to say, since the mounting package 1 is particularly purposed to carry out bump bonding in fine pitch between the IC chip 3 and the interposer 4, when a bonding displacement occurs, or the like, there is the possibility that a smallest value between bumps becomes around 1 μm. By having the filler contained in the sealing resin 15 to be a size of not more than 1 μm, resin can still be sufficiently filled between the IC chip 3 and the interposer 4 even when the smallest value of the spaces between the bumps is around 1 μm.

An IC chip mounting package in accordance with the present embodiment is suitable for accomplishing multiple output in an IC chip reduced in chip size, and is suitably used, for example, in a liquid crystal display device which incorporates such an IC chip as a liquid crystal driver.

As described above, an IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin having a coefficient of linear expansion of not more than 80 ppm/° C.

In a conventional SOF structure in which an IC chip is mounted on a package base member made of a tape carrier, in a case where sealing resin thermally expands or contracts, which sealing resin seals a section where the IC chip and the package base member are bonded, any effects caused by the expansion or contraction is absorbed by deformation of tape. However, in the present structure in which the IC chip and the package base member are connected via an interposer, the sealing resin is provided on the interposer that has high rigidity. Therefore, if the sealing resin thermally expands or contracts, the effect caused by the expansion or contraction cannot be absorbed by the deformation of the package base member. Hence, the sealing resin may easily crack.

According to the structure, by having the sealing resin have a coefficient of linear expansion of not more than 80 ppm/° C., the thermal expansion or contraction of the sealing resin is suppressed, thereby preventing cracking of the sealing resin.

Moreover, in the IC chip mounting package, the coefficient of linear expansion of the sealing resin is more preferably not more than 60 ppm/° C., and is further preferably not more than 40 ppm/° C.

Moreover, another IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin having a viscosity of not less than 0.05 Pa·s but not more than 0.25 Pa·s.

In the present structure in which a device hole is present in the package base member, if the sealing resin has a viscosity around the same viscosity as a sealing resin used in a conventional SOF structure, the sealing resin permeates too fast along the base member and through the device hole since the viscosity of the sealing resin is too low. As a result, air bubbles remain between the IC chip and the interposer. Hence, insufficient filling easily occurs.

According to the structure, by having the sealing resin have a viscosity of not less than 0.05 Pa·s but not more than 0.25 Pa·s, deficiency caused by the insufficient filling is prevented. The sealing resin does not need to demonstrate the viscosity in the above range at room temperature; for example, the sealing resin may be one which is made to have the viscosity in the above range at a time of filling due to application of heat.

Moreover, another IC chip mounting package in accordance with the present invention includes: an IC chip having input/output terminals; and a package member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the package base member, the IC chip, and the interposer being sealed with sealing resin at their respective connecting sections, and the sealing resin including filler which has a particle size of not more than 1 μm.

According to the structure, by having a filler size contained in the sealing resin be not more than 1 μm, the space between the IC chip and the interposer is sufficiently filled, even when a smallest value of the bump intervals is around 1 μm.

Moreover, each of the foregoing IC chip mounting packages are preferably arranged such that the sealing resin is provided so as to form a fillet around the IC chip, and the fillet partially covers an IC-chip-mounted side of the package base member.

Moreover, it is preferable for the sealing resin to cover at least 5 μm from a periphery of the device hole, on the IC-chip-mounted side of the package base member.

According to the structure, a reverse side (i.e., IC chip mounted side) of the package base member is covered by a fillet. This suppresses generation of resin crack from a periphery of the device hole, thereby improving reliability of resin sealing.

A method in accordance with the present invention for manufacturing an IC chip mounting package, which IC chip mounting package includes an IC chip having input/output terminals and a package base member for mounting the IC chip, and which package base member has first connection terminals, is a method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the method further including the step of: sealing the package base member, the IC chip, and the interposer with sealing resin at their respective connecting sections, the sealing resin being provided by applying the sealing resin around the interposer.

According to the structure, a fillet is securely formed around the interposer. Therefore, stability of area, particularly on a package base member side which is unstable, is enhanced. Furthermore, the device hole may be of a smaller size with respect to the IC chip than a size of the device hole with respect to the IC chip in a conventional arrangement. As a result, size reduction is possible for the IC chip mounting package itself, thereby being advantageous in costs.

Moreover, another method in accordance with the present invention for manufacturing an IC chip mounting package, which IC chip mounting package includes an IC chip having input/output terminals and a package base member for mounting the IC chip, and which package base member has first connection terminals, is a method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, the method further including the step of: sealing the package base member, the IC chip, and the interposer with sealing resin at their respective connecting sections, the sealing resin being provided by applying the sealing resin around the IC chip.

According to the structure, resin filling performance is improved, particularly in a space between the IC chip and the interposer. This makes it possible to avoid insufficient resin filling.

The invention claimed is:

1. An IC chip mounting package comprising:
   an IC chip having input/output terminals; and
   a package base member for mounting the IC chip, the package base member having first connecting terminals,
   the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals,
   the IC chip being provided inside a device hole of the package base member,
   the package base member, the IC chip, and the interposer being sealed with sealing resin at their respective connecting sections,
   a distance between a shorter side of the IC chip and a shorter side of the device hole being larger than a distance between a longer side of the IC chip and a longer side of the device hole, and
   the sealing resin having a coefficient of linear expansion of not more than 80 ppm/° C.

2. An IC chip mounting package comprising:
   an IC chip having input/output terminals; and
   a package base member for mounting the IC chip, the package base member having first connecting terminals,
   the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals,
   the IC chip being provided inside a device hole of the package base member,
   the package base member, the IC chip, and the interposer being sealed with sealing resin at their respective connecting sections,
   single one distance between a side of the IC chip and a neighboring side of the device hole being larger than any of three distances between the other sides of the IC chip and neighboring sides of the device hole, and
   the sealing resin having a coefficient of linear expansion of not more than 80 ppm/° C.

3. The IC chip mounting package as set forth in claim 1, wherein the coefficient of linear expansion is not more than 60 ppm/° C.

4. The IC chip mounting package as set forth in claim 2, wherein the coefficient of linear expansion is not more than 60 ppm/° C.

5. The IC chip mounting package as set forth in claim 1, wherein the coefficient of linear expansion is not more than 40 ppm/° C.

6. The IC chip mounting package as set forth in claim 2, wherein the coefficient of linear expansion is not more than 40 ppm/° C.

7. An IC chip mounting package comprising:
   an IC chip having input/output terminals; and
   a package base member for mounting the IC chip, the package base member having first connecting terminals,
   the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals,
   the IC chip being provided inside a device hole of the package base member,
   the package base member, the IC chip, and the interposer being sealed with sealing resin at their respective connecting sections,
   a distance between a shorter side of the IC chip and a shorter side of the device hole being larger than a distance between a longer side of the IC chip and a longer side of the device hole, and
   the sealing resin including filler which has a particle size of not more than 1 μm.

8. An IC chip mounting package comprising:
   an IC chip having input/output terminals; and
   a package base member for mounting the IC chip, the package base member having first connecting terminals,
   the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals,
   the IC chip being provided inside a device hole of the package base member,
   the package base member, the IC chip, and the interposer being sealed with sealing resin at their respective connecting sections,
   single one distance between a side of the IC chip and a neighboring side of the device hole being larger than any of three distances between the other sides of the IC chip and neighboring sides of the device hole, and
   the sealing resin including filler which has a particle size of not more than 1 μm.

9. The IC chip mounting package as set forth in claim 1, wherein
   the sealing resin is provided so as to form a fillet around the IC chip, and
   the fillet partially covers an IC-chip-mounted side of the package base member.

10. The IC chip mounting package as set forth in claim 2, wherein
    the sealing resin is provided so as to form a fillet around the IC chip, and
    the fillet partially covers an IC-chip-mounted side of the package base member.

11. The IC chip mounting package as set forth in claim 9, wherein the sealing resin covers at least 5 µm from a periphery of the device hole, on the IC-chip-mounted side of the package base member.

12. The IC chip mounting package as set forth in claim 10, wherein the sealing resin covers at least 5 µm from a periphery of the device hole, on the IC-chip-mounted side of the package base member.

13. The IC chip mounting package as set forth in claim 7, wherein
the sealing resin is provided so as to form a fillet around the IC chip, and
the fillet partially covers an IC-chip-mounted side of the package base member.

14. The IC chip mounting package as set forth in claim 8, herein
the sealing resin is provided so as to form a fillet around the IC chip, and
the fillet partially covers an IC-chip-mounted side of the package base member.

15. The IC chip mounting package as set forth in claim 13, wherein the sealing resin covers at least 5 µm from a periphery of the device hole, on the IC-chip-mounted side of the package base member.

16. The IC chip mounting package as set forth in claim 14, wherein the sealing resin covers at least 5 µm from a periphery of the device hole, on the IC-chip-mounted side of the package base member.

* * * * *